United States Patent
Cowles et al.

(10) Patent No.: US 6,449,203 B1
(45) Date of Patent: Sep. 10, 2002

(54) REFRESH CONTROLLER AND ADDRESS REMAPPING CIRCUIT AND METHOD FOR DUAL MODE FULL/REDUCED DENSITY DRAMS

(75) Inventors: Timoty B. Cowles; Michael A. Shore, both of Boise; Patrick J. Mullarkey, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/803,365

(22) Filed: Mar. 8, 2001

(51) Int. Cl.$^7$ .................................................. G11C 7/00
(52) U.S. Cl. ...................................... 365/222; 365/233
(58) Field of Search ................................ 365/222, 149, 365/230.04, 233, 230.06

(56) References Cited

U.S. PATENT DOCUMENTS

| | | | |
|---|---|---|---|
| 5,321,662 A | * 6/1994 | Ogawa | 365/191 |
| 5,781,483 A | 7/1998 | Shore | 365/200 |
| 5,828,619 A | * 10/1998 | Hirano | 365/222 |
| 5,953,266 A | 9/1999 | Shore | 365/200 |
| 5,966,334 A | 10/1999 | Shore | 365/200 |
| 6,023,432 A | 2/2000 | Shore | 365/200 |
| 6,044,029 A | 3/2000 | Shore | 365/200 |
| 6,104,641 A | * 8/2000 | Itou | 365/149 |
| 6,134,167 A | * 10/2000 | Atkinson | 365/222 |
| 6,246,619 B1 | * 6/2001 | Ematrudo et al. | 365/201 |

* cited by examiner

Primary Examiner—Vu A. Le
Assistant Examiner—VanThu Nguyen
(74) Attorney, Agent, or Firm—Dorsey & Whitney LLP

(57) ABSTRACT

A dual mode, full density/half density SDRAM includes a refresh controller specifically adapted to refresh memory cells of the SDRAM in the half density mode at a rate that is significantly slower than the rate at which the memory cells are refreshed in the full density mode. In the full density mode, the refresh controller increments a counter at a rate that is half the rate the counter is incremented in the full density mode. A refresh trigger pulse, which initiates the refresh of the memory cells, is generated when the counter has incremented to one of a first counter stage in the full density mode and a counter stage two stages beyond the first counter stage in the half density mode. Circuitry is also provided for ignoring some auto-refresh commands applied to the SDRAM in the half density mode so that the memory cells are also refreshed less frequently in the auto-refresh mode. The SDRAM also includes circuitry for remapping one of the row address bits for use as a column address bit in the half density mode so that the SDRAM can interface with system adapted for conventional dual mode SDRAMs.

12 Claims, 4 Drawing Sheets

REFRESH CONTROLLER AND ADDRESS REMAPPING CIRCUIT AND METHOD FOR DUAL MODE FULL/REDUCED DENSITY DRAMS

TECHNICAL FIELD

The invention relates to dynamic random access memories ("DRAMs") and, more particularly, to a system and method for optimally controlling the refresh and addressing of DRAMs operating in either a full density mode or a reduced density mode, such as a half density mode.

BACKGROUND OF THE INVENTION

DRAMs use one or more arrays of memory cells arranged in rows and columns. Each of the rows of memory cells is activated by a corresponding row line, which is selected from a row address. A pair of complementary digit lines are provided for each column of the array, and a sense amplifier coupled to the digit lines for each column is enabled responsive to a respective column address. The sense amplifier senses a small voltage differential between the digit lines and amplifies such voltage differential. In a "folded digit line" memory architecture, the complementary digit lines extend through the same array. In the typical folded digit line architecture, the memory cells in the odd rows are coupled to one of the digit lines in each column, and the memory cells in the even rows are coupled to the other of the digit lines in each column. However, other connection arrangements are also possible. In a folded digit line architecture, a sense amplifier senses a voltage differential between a high voltage level coupled to a digit line by a memory cell in an one row and a low voltage level coupled to a complementary digit line by a memory cell in a different row as either a logic "1" or a logic "0".

Both digit lines of each column are typically precharged to one-half the supply voltage $V_{cc}$, a voltage known as "DVC2," prior to being coupled to a memory cell. Coupling the memory cell to the digit line causes the voltage on the digit line to increase slightly above DVC2 or decreased slightly below DVC2. The sense amplifier compares this altered voltage to the voltage DVC2 on the complementary digit line and then drives the digit line coupled to the memory cell to the full high or low logic level, thereby restoring the voltage on the memory cell to the voltage corresponding to the logic level stored in the memory cell. The logic level stored in the memory cell can then be read by determining the differential voltage between the digit lines.

As is well-known in the art, DRAM memory cells must be periodically refreshed to avoid a loss of data. The memory cells in a row can be refreshed by simply coupling the, memory cells in the row to one of the digit lines after enabling the sense amplifiers. The sense amplifiers then restore the voltage level on the memory cell capacitor to a voltage level corresponding to the stored data bit. The permissible time between refreshes without losing data depends upon a variety of factors, including the rate at which charge is dissipated in memory cell capacitors. When a memory cell capacitor is excessively discharged from a high logic level, generally equal to the supply voltage, $V_{cc}$, or excessively charged from a low logic level, generally ground, its logic level of can no longer be accurately read.

One problem with conventional DRAMs results from individual memory cells becoming defective such as, for example, as a result of a shorted memory cell capacitor. A memory access to a defective memory cell must be redirected to a different memory cell so that data will be accurately read from a DRAM. Redundant rows and columns of memory cells are typically provided for this purpose. However, a substantial amount of an additional circuitry must be provided to redirected memory accesses to redundant memory cells.

One approach to solving this defective memory cell problems is disclosed in U.S. Pat. No. 6,044,029, which is incorporated herein by reference. As described therein, memory cells are effectively "repaired" by writing data bits to and reading data bits from a column of memory cells by coupling two memory cells in respective rows to the same digit line or different digit lines for that column. Thus, for example, the memory cell in an even row is coupled to a digit line and the memory cell in an odd row is coupled to the complimentary digit line. If one of the memory cells is defective, the charge from the non-defective memory cell can change the voltage on the digit line to be detected by the sense amplifier Although using two memory cells to store in each bit of data provides the advantage discussed above, it has the disadvantage of reducing the capacity of a memory array by 50 percent.

Another disadvantage of operating in a half density mode as described in U.S. Pat. No. 6,044,029 stems from the difficulty of interfacing the DRAM to computer circuitry when the DRAM is operating in the half density mode. A conventional dual mode, half density/full density 128 MB synchronous DRAM ("SDRAM") is organized into 4 banks each having 4096 rows and 1024 columns. When this conventional 128 MB SDRAM is operating in the half density mode, it is organized into 4 banks each having 4096 rows and only 512 columns. Thus, when operating in the full density mode, there will be 12 bits of row address RA0–RA11 and 10 bits of column address CAO–CA9. When operating in the half density mode, there will still be 12 bits of row address RA0–RA11 but only 9 bits of column address CAO–CA8. However, the SDRAM described in U.S. Pat. No. 6,044,029 operates in the half density mode in a manner that is different from the operation of conventional dual mode SDRAMs. The SDRAM described in U.S. Pat. No. 6,044,029 has the same addressing configuration as the conventional SDRAM when operating in the full density mode, i.e., 12 bits of row address RA0*14 RA11 and* 10 bits of column address CAO–CA9. However, when operating in the half density mode, the SDRAM described in U.S. Pat. No. 6,044,029 has the same number of column address bits, i.e., 10 column address bits CAO–CA9, but half as many row address bits, i.e., 11 row address bits RA0–RA10, since 2 rows. of memory cells are used to store each row of data. As a result, systems designed to operate with conventional SDRAMs operating in a half density mode provide RA0–RA11 row address bits and CAO–CA8 column address bits rather than the RA0–RA10 row address bits and the CAO–CA9 column address bits required by SDRAMs of the type described in U.S. Pat. No. 6,044,029. For this reason, it can be difficult to interface SDRAMs of the type described in U.S. Pat. No. 6,044,029 to systems that have been designed for conventional dual mode SDRAMs.

There is therefore a need for solutions to the above-described problems with and limitations of DRAM's of the type described in U.S. Pat. No. 6,044,029, thus improving the usefulness of such DRAM's.

SUMMARY OF THE INVENTION

A refresh controller is used in a synchronous dynamic random access memory having a full density mode and a reduced density mode. The refresh controller refreshes the SDRAM at a first rate when the SDRAM is operating in the full density mode and at a second rate that is slower than the first rate when the SDRAM is operating in the reduced density mode. The refresh controller functions in this manner in both an auto-refresh mode, in which external refresh command are applied to the SDRAM, and in a self-refresh mode, in which periodic refresh commands are internally generated. For operation in the self-refresh mode, the refresh controller preferably includes an oscillator generating a first periodic clock signal, which is applied to a frequency division circuit to generate a second periodic clock signal having a frequency that is less than the frequency of the first periodic signal. A, first selector circuit is preferably used to apply the first periodic clock signal to an output terminal in the full density mode and to apply the second periodic clock signal to the output terminal in the reduced density mode. A counter may be coupled to the output terminal of the first selector circuit. A second selector circuit preferably couples a first stage of the counter to an output terminal in the full density mode and a different stage of the counter to the output terminal in the reduced density mode. The output of the second selector circuit is then used to trigger a refresh of the SDRAM. For operation in the auto-refresh and self-refresh modes, the refresh controller preferably includes an auto-refresh circuit that ignores a predetermined percentage of the externally applied auto-refresh commands and processes the remaining auto-refresh commands. Conventional memory controllers (not shown) must apply a specific number of auto-refresh commands to an SDRAM device to refresh every row in the memory device. The specific number of auto-refresh commands that must be applied is a function of the capacity of the memory device. In the half density mode, only half as many auto-refresh commands are required to refresh every row in the memory device because two rows are refreshed for every auto-refresh command. However, if a half-density SDRAM is used in a system in place of a full-density SDRAM, the memory controller or other device will continue to apply the number of auto-refresh commands that the full-density SDRAM requires. As a result, each row in the half-density SDRAM will be refreshed far more frequently than is required, thereby excessively consuming power.

In another aspect of the invention, a specific row address bit is stored responsive to a row address strobe signal. In the half density mode, the stored row address bit is used as a specific column address bit, thereby remapping a row address bit to a column address in the half density mode.

DETAILED DESCRIPTION OF THE INVENTION

Figure 1:
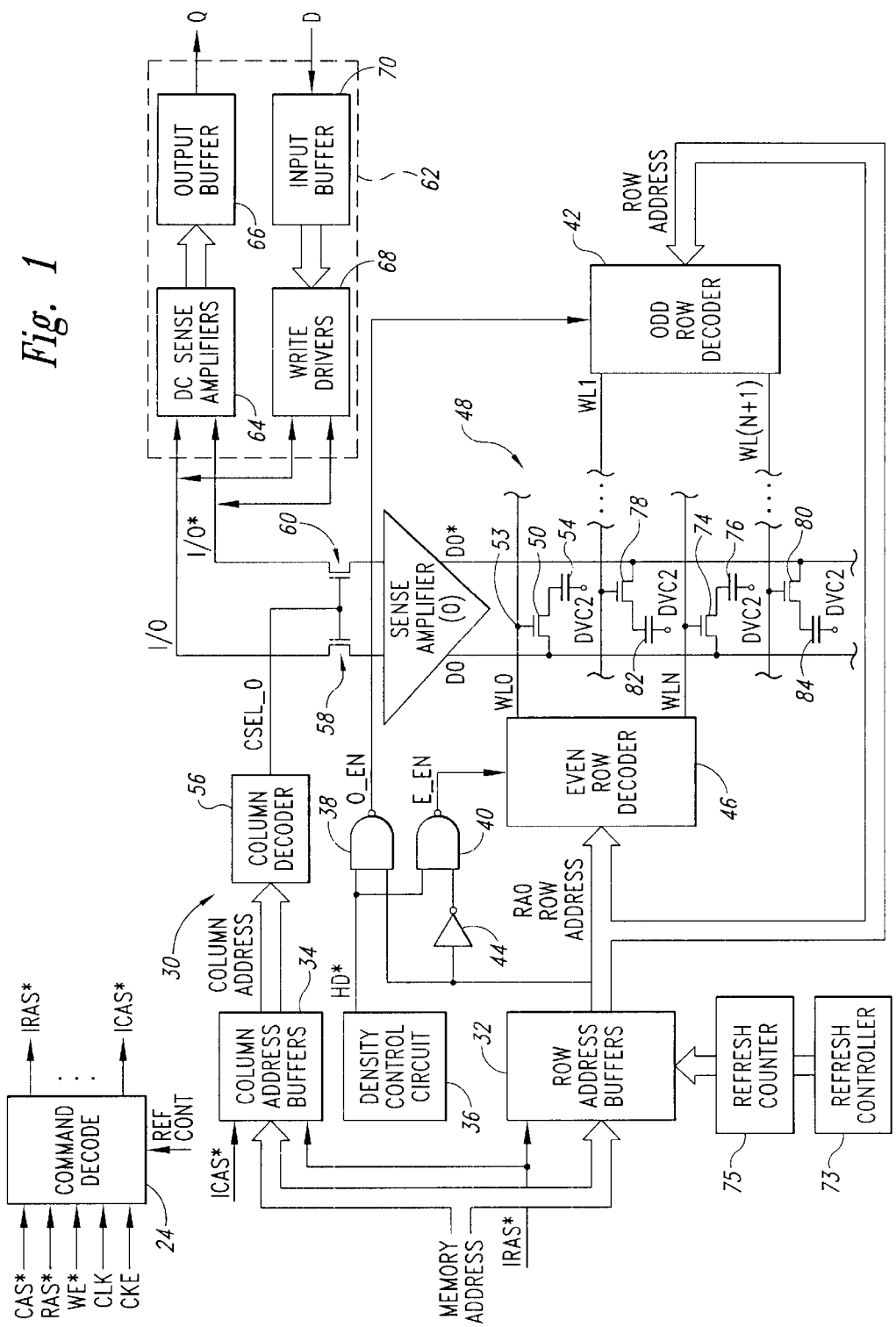
FIG. 1 is a block diagram of an SDRAM in accordance with one embodiment of the invention.

FIG. 1 is a block diagram of a synchronous dynamic random access memory ("SDRAM") 20 according to one embodiment of the invention. The SDRAM 20 includes row and column address buffers 32 and 34 receiving a time-multiplexed row and column addresses, respectively. The SDRAM 20 also includes a command decoder 24 receiving several command signals, including a row address strobe signal RAS*, a column address strobe signal CAS*, a write enable signal WE*, a clock signal CLK, and a clock enable signal CKE. As is well known in the art, various combinations of these command signals correspond to respective memory commands, such as activate, read, write, precharge, etc. The command decoder 24 then generates control signals corresponding to the memory commands, including a read command and a write command. Two of the control signals generated by the command decoder 24 are an internal row address strobe signal IRAS and an internal column address strobe signal ICAS*. It will be understood by those having skill in the field of this invention that the address buffers 32 and 34 may comprise any circuitry for buffering memory addresses, including, for example, pre-decoders and array buffers. Also, it will be understood that the SDRAM 20 may receive any number of address bits. in any configuration, including both multiplexed and non-multiplexed addressing schemes. Also, the SDRAM 20 may be any type of DRAM, such as an asynchronous DRAM or a packetized DRAM such as an SLDRAM or an RDRAM.

The SDRAM 20 operates in either a full density mode or a half density mode. In the full density mode, in response to an activate or auto-refresh command (implemented by specific combinations of command signals applied the command decoder 24), the row address buffers 32 operate in a well known manner to latch in a first plurality of address bits A0, A1, . . . , and Az from the Memory Address and then output a corresponding Row Address that includes row address bits RA0, RA1, . . . , RAz. A sense amplifier (0) also equilibrates voltages on a pair of complementary digit lines D0 and D0* to a predetermined voltage, such as the cell plate voltage DVC2. In the full density mode, a density control circuit 36 outputs an inactive high half density "HD*" signal to inputs of first and second NAND gates 38 and 40, thereby enabling the NAND gates 38, 40. The density control circuit 36 may be, for example, a conventional mode register or a bank of programmable elements, such as antifuses. As a result, when the least significant row address bit RA0 is high, the NAND gate 38 outputs an inactive low O__EN signal to disable an odd row decoder 42. At the same time, an inverter 44 outputs a low, causing the NAND gate 40 to output an active high even row decoder enabling E__EN signal to enable an, even row decoder 46. The enabled even row decoder 46 then energizes one of a plurality of even word lines (i.e., rows) WL0–WLN in a SDRAM array 48 selected in accordance with the row address bits RA1, . . . , Raz in a well known manner. It will be understood that the SDRAM 20 will normally include memory arrays in addition to the array 48, but these have been omitted from FIG. 1 in the interest of brevity and clarity.

When, in the full density mode, the row address bit RA0 is low, the NAND gate 38 outputs an active high odd row decoder enabling signal $O_{13}EN$ to enable the odd row decoder 42 and, at the same time, the inverter 44 outputs a high, causing the NAND gate 40 to output an inactive low even row decoder enabling signal E__EN to disable the even row decoder 46. The enabled odd row decoder 42 then energizes one of a plurality of odd word lines WL1 and WL(N–1) selected in accordance with the row address bits RA1, . . . , Raz in a well known manner. Thus, in the full density mode, a single row of memory cells is selected for each row address as designated by all of the row address bits RA0, . . . , Raz.

If, for example, the even word line WL0 is energized as described above in the full density operating mode of the SDRAM 20, the energized even word line WL0 activates an NMOS transistor 50 in a memory cell 52 in the array 48 through a control terminal 53 of the NMOS transistor 50. The array 48 is shown in FIG. 1 as having N memory cells for clarity, it will be understood that the array 48 may include millions of memory cells in one or more memory banks.

As a result of the NMOS transistor 50 being activated, a storage capacitor 54 storing a positive electric charge representing a "1" bit, for example, is connected to the digit line D0 through the activated NMOS transistor 50 and an access terminal 55 (e.g., a digit line contact). Of course, while only one pair of complementary digit lines D0 and D0*, and only one sense amplifier (0), are shown in FIG. 1 for clarity, it will be understood that the SDRAM array 48 includes a multitude of complimentary digit line pairs and sense amplifiers.

When the storage capacitor 54 is connected to the digit line D0 through the activated NMOS transistor 50 and the access terminal 55, the capacitor 54 discharges its positive electric charge to the digit line D0. As a result, a voltage on the digit line D0 rises by a small amount of voltage. During the same period of time, in response to a read/write command, the column address buffers 34 operate in a well known manner to latch in a plurality of column address bits A0, A1, . . ., and Az and then output a corresponding column address to a column decoder 56. The column decoder 56 then energized a sense amplifier (0) for a column corresponding to the column address. If the positive electric charge stored in the storage capacitor 54 is sufficient to exceed a detection threshold of the sense amplifier (0), the sense amplifier (0) detects the change in voltage relative to the voltage on the complimentary digit line D0* and, in response, drives the digit line D0 to the supply voltage and the digit line D0* approximately to ground potential. The column decoder 56 then energizes a column select signal CSEL_0 selected in accordance with the column address in a well-known manner, thereby activating a pair of input/output gating NMOS transistors 58 and 60. As a result, the voltages on the digit lines D0 and D0* are transferred through an input/output bus to a data buffer 62.including well known DC sense amplifiers 64, an output buffer 66, write drivers 68, and an input buffer 70. The data buffer 62 then outputs the "1" bit as an output data signal Q to external circuitry (not shown). Of course, it will be understood that other types of data buffers, including those that do not contain DC sense amplifiers, output buffers, write drivers, and input buffers may be used.

If, on the other hand, the odd word line WL1 is energized as described above in the full density operating mode of the SDRAM 20, the energized odd word line WL1 activates an NMOS transistor 78. As a result of the NMOS transistor 78 being activated, a storage capacitor 82 storing a positive electric charge representing a "0" bit, for example, is connected to the digit line D0* through the activated NMOS transistor 78. The capacitor 82 is discharged to the digit line D0*, which was previously precharged to DVC2. As a result, a voltage on the digit line D0* rises by a small amount of voltage. If the positive electric charge stored in the storage capacitor 82 is sufficient to exceed a detection threshold of the sense amplifier (0), the sense amplifier (0) detects the change in voltage relative to the voltage on the digit line D0 and, in response, drives the digit line D0 to ground potential and the digit line D0* approximately to the supply voltage. As a result, the voltages on the digit lines D0 and D0* are transferred through an input/output bus to a data buffer 62, which outputs a "1" bit as an output data signal Q to external circuitry (not shown).

In the half-density mode, the density control circuit 36 outputs an active low half density HD* signal to inputs of the first and second NAND gates 38 and 40. As a result, the NAND gate 38 outputs a high, active odd row decoder enabling signal O_EN to enable the odd row decoder 42, and the NAND gate 40 outputs a high, active even row decoder enabling signal E_EN to enable the even row decoder 46. Both the even row decoder 46 and the odd row decoder 42 are thus enabled for all row addresses.

During operation in the half density mode, in response to a read/write command, the row address buffers 32 operate in the same well known manner to latch in the first plurality of address bits A0, A1, . . . , and Az from. the Memory Address and then output a corresponding Row Address that includes row address bits RA0, RA1, . . . , RAz. The sense amplifier (0) also equilibrates the voltages on the digit lines D0 and D0* to the cell plate voltage DVC2.

Because the even row decoder 46 is always enabled in the half density mode as described above, it energizes an even word line WL0–WLN selected in accordance with the row address bits RA1, . . . , RAz. As a result, the NMOS transistor 50 or an NMOS transistor 74 is activated, connecting the storage capacitor 54 or a storage capacitor 76, respectively, to the digit line D0 through the activated NMOS transistor 50 or 74 and the access terminal 55 or an access terminal 77 (e.g., a digit line contact). At the same time, because the odd row decoder 42 is also always enabled in half density mode, it energizes an odd word line WL1–WL(N−1) also selected in accordance with the row address bits RA1, . . . , RAz. As a result, an NMOS transistor 78 or 80 is activated, connecting a respective storage capacitor 82 or 84 to the respective complimentary-digit line D0* through the activated NMOS transistor 78 or 80 and the respective access terminal 55 or 77. Thus, in the half density mode, the least significant row address bit R0 is no longer used by the row decoders 42, 46, and two rows, i.e., an even row and an odd row, which may, but need not be, adjacent to each other, are activated for each row address RA1, . . . , RAz. However, as explained below, the least significant row address bit R0 is remapped to a column address bit by applying it to the column decoder 56.

The above explanation of the operation of the SDRAM 20 responsive to memory commands is with respect to a synchronous DRAM. However, as mentioned above, the DRAM may be any type of DRAM, such as an asynchronous DRAM or a packetized DRAM, such as an SLDRAM or an RDRAM. Accordingly, the memory commands and the operation of these types of DRAMs responsive to such memory commands would differ slightly from the above explanation, but the basic principle would be the same.

Although the SDRAM 20 is shown in FIG. 1 with the access transistors 50, 74 for the even rows coupled. to the digit line D and the access transistors 78, 80 for the odd rows coupled to the complimentary digit line D*, other arrangements are possible. For example, the access transistors 50, 78 for an even row and an adjacent odd row may both be coupled to the digit line D, and the access transistor 74 for another even row and an adjacent odd row 80 may both be coupled to the complimentary digit line D*. However, coupling respective memory cells in simultaneously activated rows to the digit line D0 and its compliment D0* has the advantage of being able to read data faster for two reasons. First, coupling respective memory cells to complimentary digit lines ensures that one of the digit lines will be driven to ground potential, which can happen more rapidly than driving a digit line to the supply voltage $V_{cc}$. In the half density SDRAM described above, one of the memory cells that is to be coupled to a digit line will always be at ground potential, and the other of the memory cells that is to be coupled to a digit line will always be at a high voltage, generally $V_{cc}$. However, NMOS transistors that are typically used as access transistors coupled between the digit lines and the memory cells will switch faster if they are coupled to a memory cell at ground potential than if they are coupled to a memory cell at $V_{cc}$. The reason for this faster coupling is that a word line driving the access transistor need only increase from ground potential to the threshold voltage $V_T$ of the transistor. In contrast, a word line driving an NMOS access transistor coupled to a memory cell at $V_{cc}$ must increase to the sum of DVC2 and $V_T$ to turn on the access transistor. In a conventional full density SDRAM, an access transistor may turn on rapidly if the memory cell to which it is coupled is at ground potential. But it may alternatively turn on very slowly if the memory cell is at $V_{cc}$. By ensuring there is always one memory cell at ground potential, half-density SDRAMs are able to perform memory reads at a faster rate, and they are able to do so more consistently since every read occurs under the same set of conditions.

The second reason why coupling respective memory cells to the digit line D0 and its compliment D0* ensures faster reads is because the voltage differential increases faster when the voltages on the both digit lines are changing in opposite directions compared to the rate at which the voltage differential changes when the voltage on only one digit lines is changing. More specifically, when a sense amplifier compares the voltage on a digit line to a voltage level of DVC2 on the other digit line, the sense amplifier subsequently drives the complementary digit lines to opposite logic levels. Because the voltage differential between the digit lines is initially very small, it requires a substantial period of time for the digit lines to be driven to opposite logic levels. However, by coupling simultaneously activated rows to the digit line D0 and its compliment D0*, the initial voltage differential between the digit lines D0 and D0* is greater than if only one of the digit lines is coupled to a memory cell. As a result. the sense amplifier (0) is able to drive the digit lines to opposite logic levels more quickly, thereby allowing faster memory read operations.

It should be understood that, although the SDRAM 20 has been described as including both odd and even row decoders 42 and 46, any decoding circuitry capable of energizing two or more word lines in accordance with each Memory Address may be used. It will also be understood that the SDRAM 20 has less total storage capacity in the half density mode. Specifically, in the full density mode, the SDRAM 20 has a capacity of M rows*N columns, but in the half density mode, has a capacity of M/2 rows*N columns. However, as mentioned above, commercially available dual mode SDRAMs having a capacity of M rows*N columns have a capacity in the half density mode of M rows*N/2 columns. Thus, computer and other systems designed to provide row and column addresses to conventional memory devices with M rows and N/2 columns may be unable to operate with the SDRAM 20 of FIG. 1, which requires row and column addresses for M/2 rows and N columns. As explained in greater detail below, the column address buffers 34 are designed to remap one of the row address to a column address, thereby making the SDRAM 20 with a capacity of M/2 rows*N columns plug compatible with SDRAMs adapted to receive row addresses for M rows and column addresses for N/2 columns.

As is well known in the art, the storage capacitors 54, 82, 76, 84 used as the memory cells must be periodically refreshed to avoid a loss of data resulting from charge leaking from the capacitors. A refresh controller 73 driving a refresh counter 75 is provided for this purpose. As explained in greater detail below, in a self refresh mode, the refresh controller 73 periodically generates a refresh trigger pulse to cause the refresh counter 75 to refresh the rows of memory cells in the SDRAM array 48. The refresh controller 73 also detects that the SDRAM 20 has entered the self refresh mode, and also causes a refresh trigger pulse to be generated at that time. In response to each refresh trigger pulse, the refresh counter 75 increments to generate row addresses that are applied to the row decoders 42, 46. The row decoders 42, 46 then activate word lines corresponding to the addresses from the refresh counter 75 to refresh the memory cells in each row of the array 48.

In the half density mode, two word lines are activated each time a row is selected for being refreshed. Therefore, as previously explained, in the half density mode, the refresh current could be twice the refresh current of an SDRAM of equal capacity operating in its full density mode, thereby making the SDRAM 20 consume an inordinate amount of power. However, it is possible to refresh the memory cells in the array 48 less frequently in the half density mode for several reasons. First, in order for there to be a data read error, the memory cell charged to $V_{cc}$ or some other voltage must discharge to substantially ground potential, since the memory cell coupled to the complimentay digit line will remain at ground potential. In contrast, in a conventional SDRAM, a data read-error can occur if the memory cell charged to $V_{cc}$ discharges only to DVC2 (i.e., one-half $V_{cc}$). Thus, for the half density SDRAM described herein, the memory cell must discharge to a much lower voltage for a read error to occur. Further, since the memory cell in the half density SDRAM will discharge asymptotically to ground, it will require a much greater time for the voltage to reach ground potential compared to merely reaching DVC2 in a conventional full density SDRAM. Second, because either more charge is stored in the capacitors coupled to a digit line D0 or D0* (in the case of two capacitors coupled to the same digit line) or the voltage differential between complimentary digit lines D0 and D0* is greater (in the case of two capacitors coupled to different digit lines). Therefore, as explained in greater detail below, when the SDRAM 20 is operates in the self-refresh mode and when it responds to auto-refresh commands, the refresh controller 73 and the refresh counter 75 are designed to refresh the memory cells in the array 48 less frequently in the half density mode, thereby reducing the refresh current and taking advantage of the ability of the memory cells to store data for a longer period without being refreshed.

Figure 2:
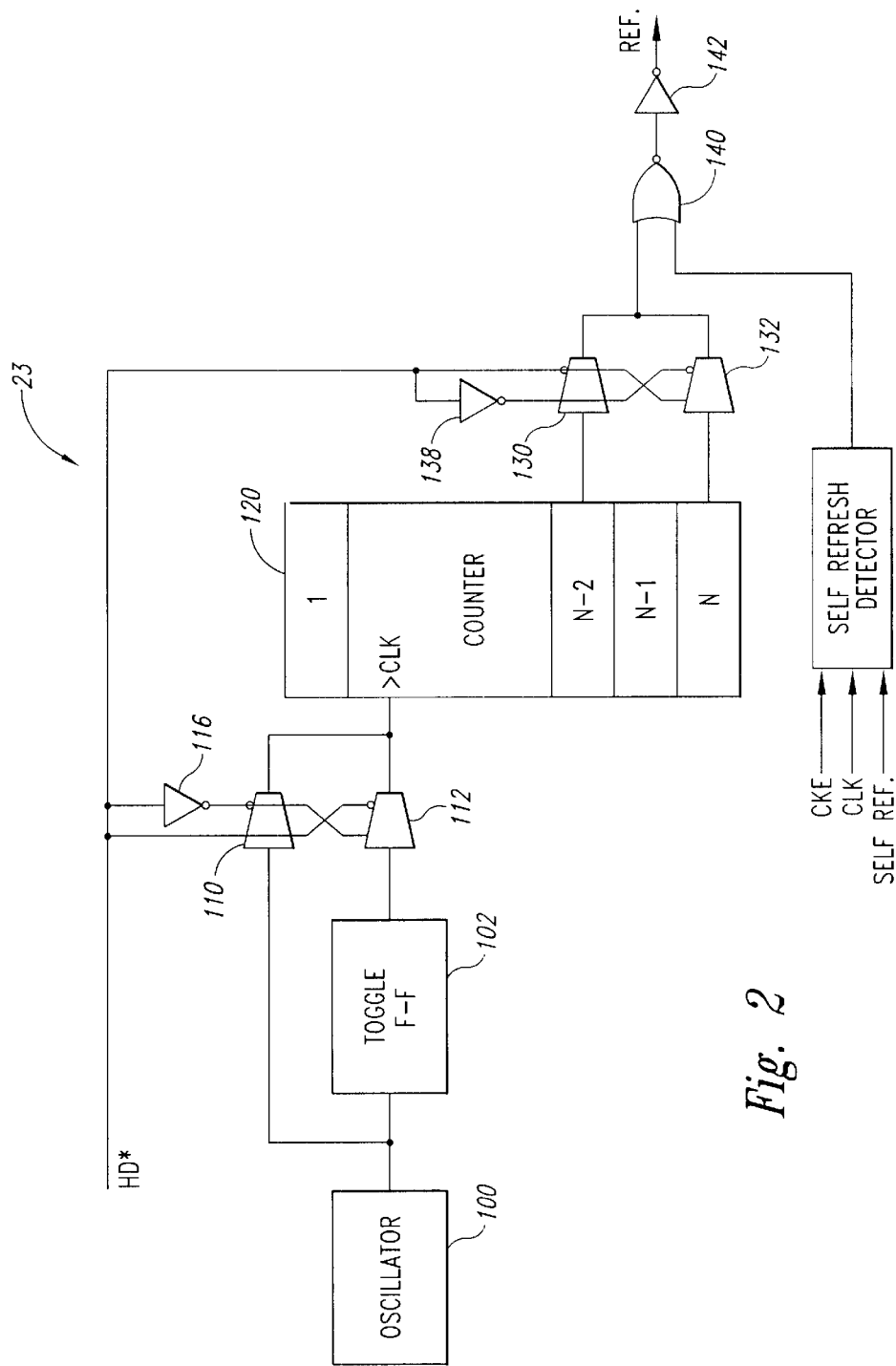
FIG. 2 is a logic and block diagram of a portion of one embodiment of a refresh controller used in the SDRAM of FIG. 1.

One embodiment of a portion of a refresh controller 73 is shown in FIG. 2. It will be understood, however, that many components of the refresh controller 73 are of conventional design and have thus been omitted from FIG. 2 in the interest of brevity. In a self-refresh mode, an oscillator 100-of conventional design normally generates a periodic pulse. The pulse is applied to a conventional toggle flip-flop 102, which outputs one pulse for every two pulses from the oscillator 100. The output of the oscillator 100 and the output of the toggle flip-flop 102 are applied to respective pass gates 110, 112, which are controlled by the active low half density HD* signal, directly and through an inverter 116. The pass gates 110, 112 are, in turn, coupled to the clock input of a counter 120.

In operation, when the HD* signal is high indicative of operation in the full density mode, the pass gate 110 is enabled and the pass gate 112 is disabled, thereby coupling the output of the oscillator 100 directly to the output of the refresh controller 73. Thus, in the full density mode, the counter 120 is incremented once for each pulse of the oscillator 100. In the half density mode, the active low HD* signal disables the pass gate 110 and enables the pass gate 112, thereby coupling the output of the toggle flip-flop 112 to the clock input of the counter 120. Thus, in the half density mode, the counter 120 is incremented once for every two pulses from the oscillator 100. Thus, in the half density mode, the counter 120 is increment half as frequently as in the full density mode.

The counter 120 includes a plurality of counter stages, including counter stage N and N-2. The N-2 counter stage is applied to a pass gate 130, while the N counter stage is applied to a pass gate 132. When the counter 120 is incremented, a pulse is applied to the pass gate 130 one-quarter as frequently as a pulse is applied to the pass gate 132. The pass gates 130, 132 are controlled by the active low half density HD* signal, directly and through an inverter 138. When the HD* signal is inactive high indicative of operation in the full density mode, the pass gate 130 is enabled, thereby coupling the output from the N-2 stage of the counter 120 to the input of a NOR gate 140. The NOR gate 140 outputs a refresh trigger pulse each time the counter 120 has been incremented to the N-2 stage. When the HD* signal is active low indicative of operation in the half density mode, the pass gate 132 is enabled, thereby coupling the output from the N stage of the counter 120 to the input of a NOR gate 140. The NOR gate 140 outputs a refresh trigger pulse from an inverter 142 each time the counter 120 has been incremented to the N stage, which occurs one-quarter as frequently as the counter incrementing to the N-2 stage. Since the counter is incremented half as frequently in the half density mode compared to the full density mode, the refresh trigger pulse is generated in the half density mode one-eight as frequently in the half density mode as it is in the full density mode. Thus, in the half density mode, the memory cells of the array 48 are refreshed one-eight as frequently as in the full density mode. As a result, the refresh current is brought down to an acceptable level.

As mentioned above, the memory cells of the array 48 must also be refreshed when the SDRAM 20 is placed in the self refresh mode. As is well known in the art, a self refresh command is designated by a self-refresh command on the first CLK signal after the CKE signal transitions inactive low. The self-refresh command is detected by a conventional self-refresh command detector 146, which then applies a high to an input of the NOR gate 140, thereby causing a refresh trigger pulse to be generated at the output of the inverter 142. Thus, a refresh trigger pulse is generated either periodically at a rate determined by the density of operation or upon entering the self-refresh mode.

Although the refresh controller 73 is described as both changing the rate at which the counter 120 is incremented and the stage of the counter 120 that is used to generate the refresh trigger signal as a function of the operating mode, it will be understood that other circuits can be used instead. For example, the refresh rate may be adjusted solely by adjusting the frequency of the signal used to clock the counter 120 or solely by selecting between different stages of the counter 120, or by some other means. If the refresh rate is adjusted by adjusting the frequency of the signal used to clock the counter 120 as shown in FIG. 2, the frequency of the signal may be adjusted by other means. For example, rather than selecting between the output of the oscillator 100 and the output of the toggle flip-flop 102, the HD* could be used to adjust the operating frequency of the oscillator 100 by suitable means.

Figure 3:
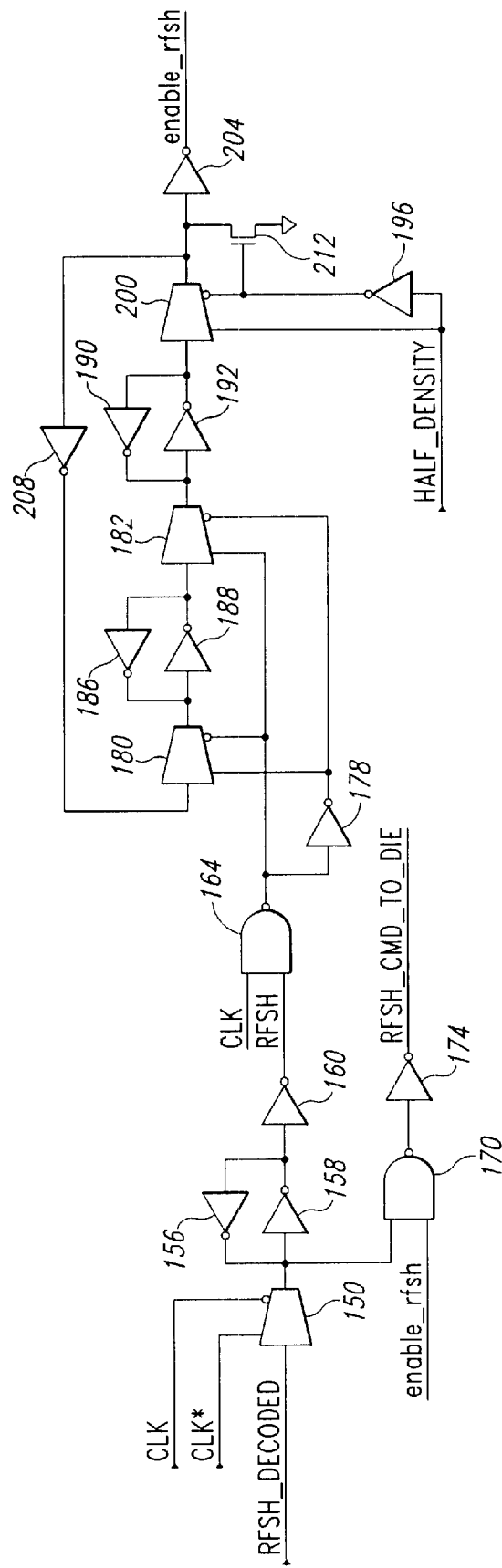
FIG. 3 is a logic and block diagram of another portion of one embodiment of a refresh controller used in the SDRAM of FIG. 1.

As mentioned above, in the half density mode, only half as many auto-refresh commands are required to refresh every row in the memory device because two rows are refreshed for every auto-refresh command. Yet the memory controller or other device may continue to apply the same number of auto-refresh commands that the full-density SDRAM requires, thereby refreshing the half density SDRAM far more frequently than is required. To avoid this problem, the SDRAM 20 must also be able to ignore some of the auto-refresh commands when it is operating in the half density mode so that it refreshes the memory cells less frequently. A portion of the refresh controller 73 that performs this function is shown in FIG. 3. An auto-refresh command is decoded by the command decoder 24 to generate a RFSH_DECODED signal that is applied to a pass gate 150. The pass gate couples an active high RFSH_DECODED signal to a latch formed by a pair of inverters 156, 158 on the falling edge of the CLK signal. An inverter 160 then outputs a high to a NAND gate 164. The latched high RFSH_DECODED signal is also applied to one input of a NAND gate 170, the other input of which receives an ENABLE_RFSH signal. As explained below, in the full density mode, the ENABLE_RFSH is always high so that the NAND gate 170 outputs a low responsive to every active high RFSH_DECODED signal, thereby causing an inverter 174 to output an active high RFSH_CMD signal. As is well known in the art, the RFSH_CMD signal causes a refresh of a row or rows of memory cells.

On the rising edge of the CLK signal following the RFSH_DECODED signal transitioning high, the NAND gate 164 outputs a low, thereby causing an inverter 178 to output a high. As a result, a first pass gate 1 80 is closed and a second pass gate 182 is opened. The output of the first pass gate 180 is then latched by a pair of cross coupled inverters 186, 188. On the next falling edge of the CLK signal, the output of the NAND gate 164 transitions high, thereby closing the second pass gate 182 and opening the first pass gate 180. The compliment of the signal that was previously latched by the inverters 186, 188 is then latched by a pair of inverters 190, 192. In the half density mode, a HALF_DENSITY signal is active high, thereby applying causing an inverter to output a low and close a third pass gate 200. The output of the pass gate 200 is coupled through an inverter 204 to generate the ENABLE_RFSH signal and is fed back though an inverter 208 to the input of the first pass gate 180. When the HALF_DENSITY signal is inactive low in the full density mode, a high at the output of the inverter 196 turns ON an NMOS transistor 212 to couple the input of the inverter 204 to ground, thus making the ENABLE_RFSH signal high. Therefore, in the full density mode, the ENABLE_RFSH signal is always high to cause a RFSH_CMD signal to be generated for each RFSH_DECODED signal, as previously explained.

In operation, let us assume that the input to the inverter 204 is high. When the output of the NAND gate 164 transitions low on the rising edge of the CLK signal after the RFSH_DECODED signal has gone high, a low at the output of the inverter 208 will be coupled through the pass gate 180, thereby causing the output of the inverter 188 to transition high. On the rising edge of the next CLK signal, the output of the NAND gate 164 will transition high, thereby closing the second pass gate 182 to couple the high at the output of the inverter 188 to the input of the inverter 192. The inverter 192 will then apply a low to the input of the inverter 204, thereby causing the inverter 204 to enable the NAND gate 170. As a result, an active high RFSH_CMD signal is generated responsive to the first RFSH_DECODED signal.

On the next RFSH_DECODED signal, the high at the output of the inverter 208 resulting from the low at the input to the inverter 204 is coupled through the pass gate 180 to the input of the inverter 188. The inverter 188 then outputs a low, which is coupled to the input of the inverter 192 on the next falling edge of the CLK signal. The low coupled to the input of the inverter 192 causes the inverter 192 to output a high, which causes the inverter 204 to disable the NAND gate 170. Thus, an active high RFSH_CMD signal is not generated responsive to the next RFSH_DECODED signal. However, that RFSH_CMD signal does cause the output of the inverter 204 to again transition high, thereby enabling the NAND gate 170 on the next RFSH_DECODED signal. As a result, an active high RFSH_CMD signal is generated responsive to every other RFSH_DECODED signal. The SDRAM 20 is thus refreshed at half the normal auto-refresh rate when operating in the half density mode.

Figure 4:
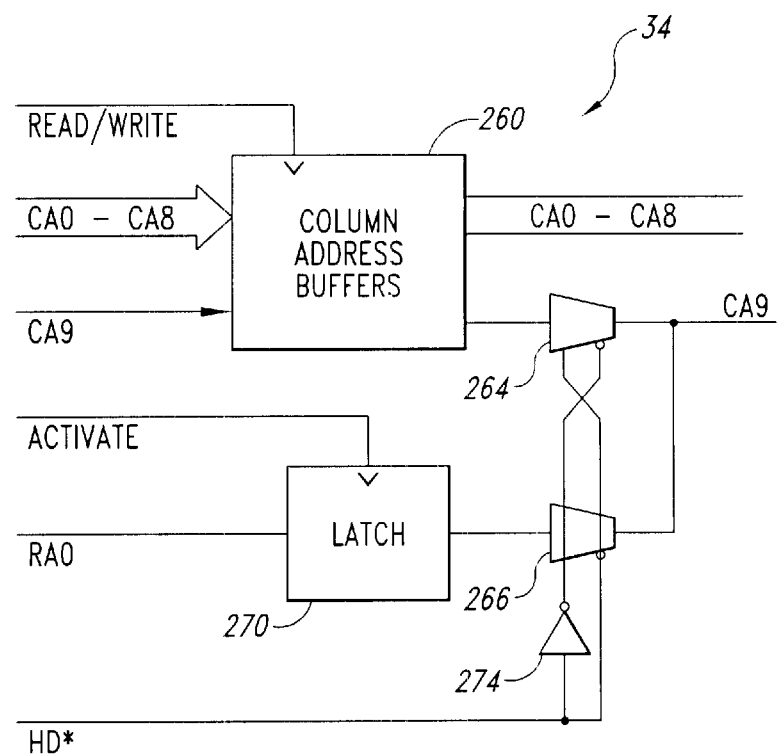
FIG. 4 is a logic and block diagram of a portion of one embodiment of a column address buffer used in the SDRAM of FIG. 1.

As mentioned above, the column address buffers 34 are designed to remap one of the row address to a column address so that the SDRAM 20 is plug compatible with SDRAMs adapted to receive row addresses for M rows and column addresses for N/2 columns. With reference to FIG. 4, a portion of the column address buffers 34 includes a latch 260 that receives ten column address bits CAO–CA9. The column address buffer 260 latches the address bids responsive to an active low column address strobe read/write command, as is well known in the art. The nine low order address bits CA0–CA8 are applied to the column decoder 56 (FIG. 1) in a conventional manner. However, the most significant column address bit CA9 is applied to a pass gate 264. Another pass gate 266 receives the output of a latch 270 that stores the most significant row address bit RA0 responsive to an activate command. The pass gates 264, 266 are controlled by the active low density control signal HD* directly and through an inverter 274. When the HD* signal is inactive high indicative of the full density mode of operation, the pass gate 264 is enabled and the pass gate 266 is disabled so that the latched most significant column address bit CA9 is applied to the column decoder 56 along with the lower order column address bits CA0–CA8. Thus, in the full density mode, the column address buffers 34 operate in a conventional manner. When the HD* signal is active low indicative of the half density mode of operation, the pass gate 264 is disabled and the pass gate 266 is enabled so that the most significant column address bit CA9 is applied by the pass gate 266. As is well known in the art, the row addresses are received prior to the column addresses, and they are latched into the SDRAM 20 responsive to the activate command. In the column address buffers 34 showed in FIG. 4, the most significant row address bit RA0 is stored in the latch 270 responsive to the activate command and is then selected by the pass gate 266 for use as the most significant column address bit CA9. In this manner, the most significant row address bit RA0 is remapped to be the most significant column address bit CA9 thereby making the SDRAM 20 with a capacity of M/2 rows*N columns plug compatible with SDRAMs adapted to receive row addresses for M rows and column addresses for N/2 columns.

Figure 5:
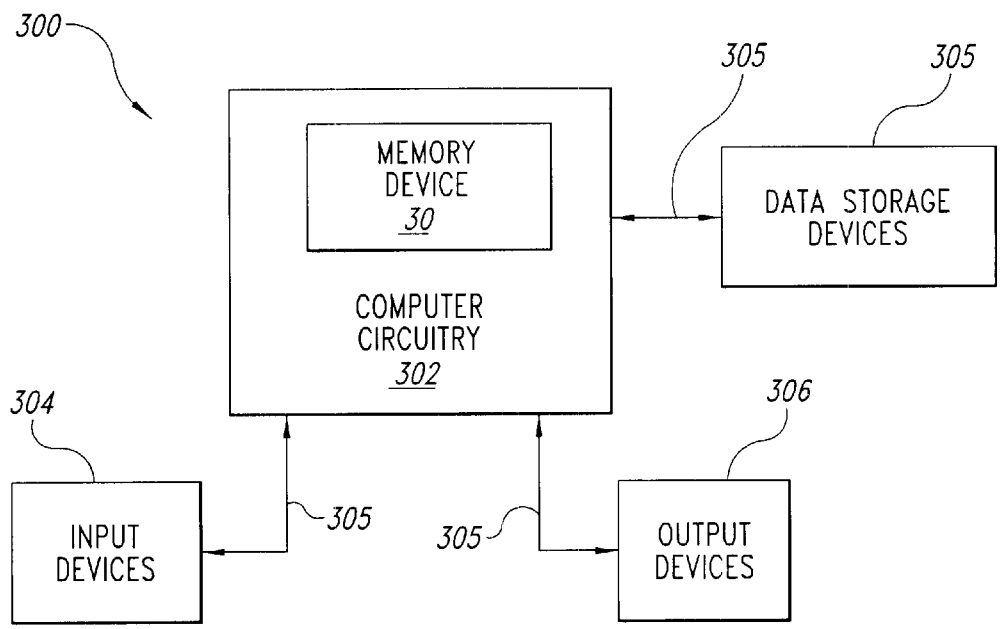
FIG. 5 is a block diagram of a computer system using the SDRAM of FIG. 1.

FIG. 5 is a block diagram of one embodiment of a computer system 300 using the SDRAM 20 of FIG. 1. The computer system 300 includes computer circuitry 302 for performing such computer functions as executing software to perform desired calculations and tasks. Circuitry 302 typically contains a processor (not shown) and the SDRAM 20 as shown. One or more input devices 304, such as a keyboard or a pointing device, is coupled to the computer circuitry 302 via a bus 305 and allows an operator (not shown) to manually input data thereto. One or more output devices 306 is coupled to the computer circuitry 302 via the bus 305 to provide to the operator data generated by the circuitry. Examples of output devices 306 include a printer and a video display unit. One or more data storage devices 308 is coupled to the computer circuitry 302 via the bus 305 to store data on or retrieve data from external storage media (not shown). Examples of storage devices 308 and associated storage media include drives that accept hard and floppy disks, magnetic tape recorders, and compact-disc read only memory (CD-ROM) readers.

From the foregoing it will be appreciated that, although specific embodiments of the invention have been described herein for purposes of illustration, various modifications may be made without deviating from the spirit and scope of the invention. For example, although the disclosed embodiment is explained as having a half density mode, it will be understood that it may instead have other reduced density modes, such as a quarter density mode in which it is refreshed one-quarter or one-eighth as frequently as when operating in the full density mode. Accordingly, the invention is not limited except as by the appended claims.

What is claimed is:

1. A refresh controller for use in a dynamic random access memory ("DRAM") having a full density mode and a reduced density mode, the refresh controller comprising:

an oscillator generating a first periodic clock signal;

a frequency division circuit coupled to receive the first periodic clock signal, the frequency division circuit being operable to generate a second periodic clock signal having a frequency that is less than the frequency of the first periodic signal; and a selector circuit coupled to receive the first periodic clock signal from the oscillator and the second periodic clock signal from the frequency division circuit, the selector circuit being operable to apply the first periodic clock signal to an output terminal in the full density mode and to apply the second periodic clock signal to the output terminal in the reduced density mode.

2. The refresh controller of claim 1 wherein the selector circuit comprises:

a first pass gate coupled between an output of the oscillator and the output terminal;

a second pass gate coupled between an output of the frequency division circuit and the output terminal; and a control circuit for enabling the first pass gate and disabling the second pass gate in the full density mode and for disabling the first pass gate and enabling the second pass gate in the reduced density mode.

3. The refresh controller of claim 1 wherein the frequency divider circuit comprises a toggle flip-flop.

4. The refresh controller of claim 1 wherein the reduced density mode comprises a half density mode.

5. A dynamic random access memory ("DRAM") comprising:

an array of memory cells arranged in rows and columns;

a column address latch structured to store a column address responsive to a column address strobe signal;

a column decoder coupled to the column address latch to receive the stored column address and enable respective sense amplifiers corresponding thereto;

a row address latch structured to store a row address responsive to a row address strobe signal;

a first row decoder coupled to the row address latch to receive the stored row address and activate respective word lines corresponding thereto, the first row decoder being enable responsive to a first enable signal;

a second row decoder coupled to the row address latch to receive the stored row address and activate respective word lines corresponding thereto, the row lines activated by the first row decoder being interleaved with the row lines activated by the second row decoder, the second row decoder being enabled responsive to a second enable signal;

a mode controller coupled to the row decoders, the mode controller being operable in a full density mode to generate the first enable signal responsive to a first state of a least significant bit of the row address and to generate the second enable signal responsive to a second state of the least significant bit of the row address, the mode controller further being operable to generate the first and second enable signals in a reduced density mode regardless of the state of the least significant bit of the row address;

a data path coupled between the memory array and a data terminal; and a refresh controller for refreshing at least some of the memory cells in the memory array responsive to a refresh trigger signal, the refresh controller comprising:

an oscillator generating a first periodic clock signal;

a frequency division circuit coupled to receive the first periodic clock signal, the frequency division circuit being operable to generate a second periodic clock signal having a frequency that is less than the frequency of the first periodic signal; and a selector circuit coupled to receive the first periodic clock signal from the oscillator and the second periodic clock signal from the frequency division circuit, the selector circuit being operable to apply the first periodic clock signal to an output terminal in the full density mode and to apply the second periodic clock signal to the output terminal in the reduced density mode, the refresh trigger signal being generated responsive to the first or second periodic clock signal being coupled to the output terminal.

6. The dynamic random access memory of claim 5 wherein the selector circuit comprises:

a first pass gate coupled between an output of the oscillator and the output terminal;

a second pass gate coupled between an output of the frequency division circuit and the output terminal; and a control circuit for enabling the first pass gate and disabling the second pass gate in the full density mode and for disabling the first pass gate and enabling the second pass gate in the reduced density mode.

7. The dynamic random access memory of claim 1 wherein the frequency divider circuit comprises a toggle flip-flop.

8. A computer system, comprising:

a data input device;

a data output device;

a processor coupled to the data input and output devices; and a dynamic random access memory, comprising:

an array of memory cells arranged in rows and columns;

a column address latch structured to store a column address responsive to a column address strobe signal;

a column decoder coupled to the column address latch to receive the stored column address and enable respective sense amplifiers corresponding thereto;

a row address latch structured to store a row address responsive to a row address strobe signal;

a first row decoder coupled to the row address latch to receive the stored row address and activate respective word lines corresponding thereto, the first row decoder being enable responsive to a first enable signal;

a second row decoder coupled to the row address latch to receive the stored row address and activate respective word lines corresponding thereto, the row lines activated by the first row decoder being interleaved with the row lines activated by the second row decoder, the second row decoder being enabled responsive to a second enable signal;

a mode controller coupled to the row decoders, the mode controller being operable in a full density mode to generate the first enable signal responsive to a first state of a least significant bit of the row address and to generate the second enable signal responsive to a second state of the least significant bit of the row address, the mode controller further being operable to generate the first and second enable signals in a reduced density mode regardless of the state of the least significant bit of the row address;

a data path coupled between the memory array and a data terminal; and a refresh controller for refreshing at least some of the memory cells in the memory array responsive to a refresh trigger signal, the refresh controller comprising:

an oscillator generating a first periodic clock signal;

a frequency division circuit coupled to receive the first periodic clock signal, the frequency division circuit being operable to generate a second periodic clock signal having a frequency that is less than the frequency of the first periodic signal; and a selector circuit coupled to receive the first periodic clock signal from the oscillator and the second periodic clock signal from the frequency division circuit, the selector circuit being operable to apply the first periodic clock signal to an output terminal in the full density mode and to apply the second periodic clock signal to the output terminal in the reduced density mode, the refresh trigger signal being generated responsive to the first or second periodic clock signal being coupled to the output terminal.

9. The computer system of claim 8 wherein the selector circuit comprises:

a first pass gate coupled between an output of the oscillator and the output terminal;

a second pass gate coupled between an output of the frequency division circuit and the output terminal; and a control circuit for enabling the first pass gate and disabling the second pass gate in the full density mode and for disabling the first pass gate and enabling the second pass gate in the reduced density mode.

10. The computer system of claim 8 wherein the frequency divider circuit comprises a toggle flip-flop.

11. A method of refreshing a dynamic random access memory ("DRAM") having a full density operating mode and a reduced density operating mode, the method comprising:

determining the operating mode of the DRAM;

if the DRAM is determined to be operating in the full density mode, refreshing the DRAM at a first rate; and if the DRAM is determined to be operating in the reduced density mode, refreshing the DRAM at a second rate, the second rate being slower than the first rate.

12. The method of claim 11 wherein the second rate is 8 times slower than the first rate.

* * * * *

UNITED STATES PATENT AND TRADEMARK OFFICE
CERTIFICATE OF CORRECTION

PATENT NO. : 6,449,203 B1
DATED : September 10, 2002
INVENTOR(S) : Timothy B. Cowles, Michael A. Shore and Patrick J. Mullarkey It is certified that error appears in the above-identified patent and that said Letters Patent is hereby corrected as shown below:

Title page,
Item [75], Inventors, "Timoty B. Cowles" should read -- Timothy B. Cowles --
Item [56], References Cited, U.S. PATENT DOCUMENTS, "omitted references" should read -- 4,961,167  10/90  Kumanoya et al.............365/189.09 --; and 5,475,645  12/95  Wada.............365/222 --
Item [57], ABSTRACT,
Line 19, "with system adapted" should read -- with systems adapted --

Column 1,
Line 32, "cell in an" should read -- cell in --
Line 40, "or decreased" should read -- or decrease --
Line 63, "logic level of can no longer" should read -- logic level can no longer --

Column 2,
Line 5, "to redirected memory" should read -- to redirect memory --
Line 19, "amplifier Although" should read -- amplifier. Although --
Line 43, "RA0*14* RA*11and*" should read -- RA0 – RA11 and --
Line 49, " 2 rows. of memory" should read -- 2 rows of memory --
Line 61, "limitations of DRAM's" should read -- limitations of DRAMs. --
Line 63, "of such DRAM's" should read -- of such DRAMs --.

Column 3,
Line 14, "A, first selector circuit" should read -- A first selector circuit --
Line 54, "FIG. 1 ." should read -- FIG. 1. --

Column 4,
Line 2, "receiving a time-" should read -- receiving time- --
Line 48, "to enable an, even" should read -- to enable an even --
Line 52, "Raz in a well known" should read -- RAz in a well known --.
Line 59, "signal $O_{13}EN$" should read -- signal O_EN --
Line 66, "Raz in a well known" should read -- RAz in a well known --

UNITED STATES PATENT AND TRADEMARK OFFICE
CERTIFICATE OF CORRECTION

PATENT NO.    : 6,449,203 B1
DATED         : September 10, 2002
INVENTOR(S)   : Timothy B. Cowles, Michael A. Shore and Patrick J. Mullarkey It is certified that error appears in the above-identified patent and that said Letters Patent is hereby corrected as shown below:

Column 5,
Line 2, "Raz." should read -- Raz. --
Line 3, "word line WLO" should read -- word line WL0 --
Line 9, "for clarity, it will be" should read -- for clarity. It will be --
Line 32, "then energized" should read -- then energizes --
Line 45, "buffer 62.including" should read -- buffer 62 including --

Column 6,
Line 38, "complimentary-digit line" should read -- complementary digit line --
Line 58, "rows coupled. to the" should read -- rows coupled to the --

Column 7,
Line 33, "one digit lines" should read -- one digit line --
Line 66, "one of the row address" should read one of the row addresses --

Column 8,
Line 48, "SDRAM 20 is" should read -- SDRAM 20 --
Line 60, "oscillator 100-of" should read -- oscillator 100 of --

Column 9,
Line 15, "is increment half" should read -- is incremented half --
Lines 41 and 43, "one-eight" should read -- one-eighth --

Column 10,
Line 38, "pass gate 1 80" should read -- pass gate 180 --
Line 44, "The compliment" should read -- The complement --
Line 47, "thereby applying causing" should read -- thereby causing --

Column 11,
Line 29, "CAO-CA9." should read -- CA0-CA9. --
Line 30, "the address bids" should read -- the address bits --

UNITED STATES PATENT AND TRADEMARK OFFICE
CERTIFICATE OF CORRECTION

PATENT NO. : 6,449,203 B1
DATED : September 10, 2002
INVENTOR(S) : Timothy B. Cowles, Michael A. Shore and Patrick J. Mullarkey It is certified that error appears in the above-identified patent and that said Letters Patent is hereby corrected as shown below:

Column 13,
Line 2, "being enable responsive" should read -- being enabled responsive --

Column 14,
Line 4, "being enable responsive" should read -- being enabled responsive --

Signed and Sealed this

Twenty-sixth Day of October, 2004

JON W. DUDAS
*Director of the United States Patent and Trademark Office*

UNITED STATES PATENT AND TRADEMARK OFFICE
CERTIFICATE OF CORRECTION

PATENT NO. : 6,449,203 B1
DATED : September 10, 2002
INVENTOR(S) : Cowles, Timoty B.

It is certified that error appears in the above-identified patent and that said Letters Patent is hereby corrected as shown below:

Column 2,
Line 61, which should read -- limitations of DRAMs. --
Line 63, which should read -- of such DRAMs. --

Column 5,
Line 2, which should read -- Raz. --

Signed and Sealed this

Fourth Day of January, 2005

JON W. DUDAS
*Director of the United States Patent and Trademark Office*